United States Patent
Chen

(10) Patent No.: US 7,420,789 B2
(45) Date of Patent: Sep. 2, 2008

(54) ESD PROTECTION SYSTEM FOR MULTI-POWER DOMAIN CIRCUITRY

(75) Inventor: Ker-Min Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 64 days.

(21) Appl. No.: 11/256,228

(22) Filed: Oct. 21, 2005

(65) Prior Publication Data

US 2007/0091522 A1    Apr. 26, 2007

(51) Int. Cl.
*H02H 9/00* (2006.01)
(52) U.S. Cl. ....................................... 361/56
(58) Field of Classification Search .................... 361/56
See application file for complete search history.

(56) References Cited

U.S. PATENT DOCUMENTS

| 6,144,542 | A | 11/2000 | Ker et al. | 361/111 |
| 6,552,583 | B1* | 4/2003 | Kwong | 327/112 |
| 6,829,125 | B2* | 12/2004 | Liu et al. | 361/56 |
| 7,136,622 | B2* | 11/2006 | Rofougaran et al. | 455/20 |
| 2003/0001199 | A1* | 1/2003 | Shibib | 257/330 |
| 2005/0270712 | A1* | 12/2005 | Huang et al. | 361/90 |
| 2006/0187596 | A1* | 8/2006 | Cain et al. | 361/56 |

\* cited by examiner

*Primary Examiner*—Michael J Sherry
*Assistant Examiner*—Christopher J Clark
(74) *Attorney, Agent, or Firm*—K & L Gates LLP

(57) ABSTRACT

The invention discloses an integrated circuit that includes a first device in a first power domain; a second device in a second power domain; and an electrostatic discharge (ESD) bus coupled to the first and second devices for providing a current path to dissipate an ESD current during an ESD event occurring at the first or second device. The ESD bus is disposed across the first and second power domains without having a diode module interposed therebetween, thereby preventing the ESD current from flowing through the first and second devices.

10 Claims, 3 Drawing Sheets

ESD PROTECTION SYSTEM FOR MULTI-POWER DOMAIN CIRCUITRY

BACKGROUND

The present invention relates generally to integrated circuit (IC) designs, and more particularly to an electrostatic discharge (ESD) protection system for multi-power domain circuitry.

A gate dielectric of a metal-oxide-semiconductor (MOS) transistor of an IC is very susceptible to damage. The gate dielectric may be destroyed by being contacted with a voltage only a few volts higher than a supply voltage of the IC. It is understood that a regular supply voltage is typically 5.0, 3.3 volts or even lower. Electrostatic voltages from common environmental sources can easily reach thousands, or even tens of thousands of volts. Such voltages are destructive even though the charge and any resulting current are extremely small. For this reason, it is of critical importance to discharge any static electric charge as it builds up, before it damages the IC.

An ESD protection circuit is typically added to an IC at its bond pads, which are the connections for the IC to outside circuitry. For example, in an operating IC, electric power is supplied to a VDD pad, electric ground is supplied to a VSS pad, electronic signals are supplied from outside to some pads, and electronic signals generated by the core circuitry of the IC are supplied to other pads for delivery to external circuits and devices. During the normal operation, the ESD protection circuit blocks a current to flow therethrough and is effectively isolated from the normally operating core circuitry. During an ESD event, the ESD protection circuit is designed to switch on quickly, thereby dissipating the ESD current to ground before its damages any logic components of the IC.

As the semiconductor processing technology advances, the gate dielectric of MOS transistor becomes thinner and increasingly susceptible to the ESD current. This issue becomes more serious when the MOS transistor is used in a multi-power domain circuitry where a diode module is typically connected to an I/O ground bus between two power domains. When the ESD occurs, the diode module may induce the ESD current to flow through a damaging path other than the I/O ground bus as a desired path, thereby damaging the thin-gate-dielectric MOS transistors.

Therefore, it is desirable to design an ESD protection system for multi-power domain circuitry that allows the ESD current to dissipate through a predefined path.

SUMMARY

The present invention discloses an integrated circuit chip. In one embodiment of the invention, the integrated circuit includes a first device in a first power domain; a second device in a second power domain; and an electrostatic discharge (ESD) bus coupled to the first and second devices for providing a current path to dissipate an ESD current during an ESD event occurring at the first or second device. The ESD bus is disposed across the first and second power domains without having a diode module interposed therebetween, thereby preventing the ESD current from flowing through the first and second devices.

The construction and method of operation of the invention, however, together with additional objectives and advantages thereof will be best understood from the following description of specific embodiments when read in connection with the accompanying drawings.

DESCRIPTION

Figure 1:
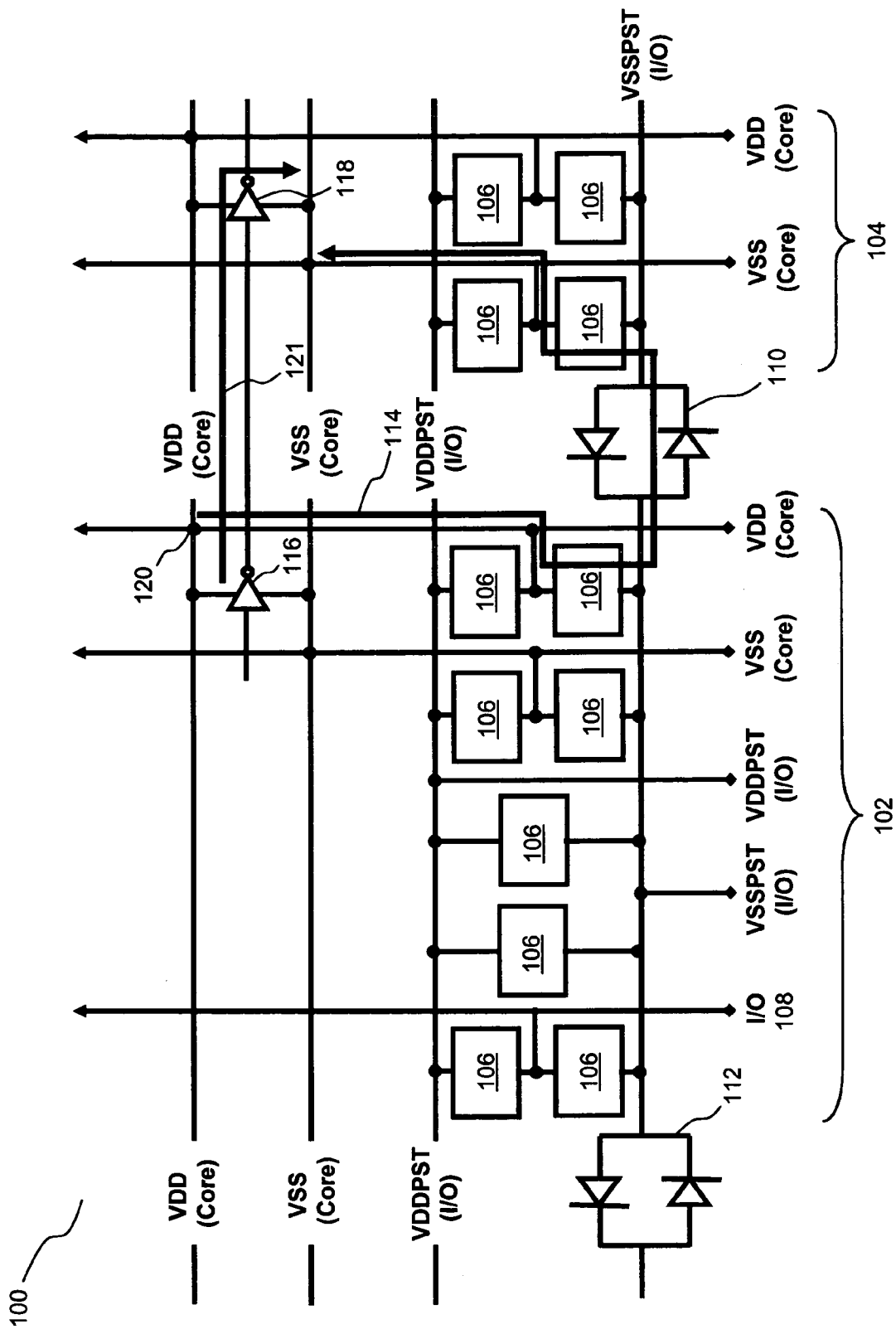
FIG. 1 illustrates a conventional multi-power domain ESD protection system.

FIG. 1 illustrates a conventional multi-power domain ESD protection system 100. As shown, the protection system 100 is designed to provide ESD protection for at least two power domains: an I/O power domain 102 and a core power domain 104. All ESD charges at both domains are designed to be dissipated into an I/O ground bus VSSPST, which is used as a global ESD bus. Various ESD protection devices 106 are implemented between bus lines such as the I/O ground bus VSSPST, a core power supply bus VDD, a core ground bus VSS, an I/O power supply bus VDDPST, and an I/O bus 108. A set of back-to-back diodes 110 is implemented on the I/O ground bus VSSPST at a boundary between the I/O power domain 102 and the core power domain 104 in order to isolate one another from simultaneous switching output (SSO) noise.

One drawback of the ESD protection system is its poor ESD protection performance for a core circuit that includes a MOS transistor having a gate dielectric equal to or thinner than 30 angstroms. This drawback becomes more serious with the presence of the back-to-back diodes, such as the diode sets 110 and 112. In an ESD event occurring at a node 120, the ESD current is supposed to dissipate to the core ground bus VSS in the core power domain 104 through a predefined current path 114. However, due to the presence of the back-to-back diodes 110, the ESD current may find its way to the core ground bus VSS from an invert 116 in the core power domain 102 to an inverter 118 in the core power domain 104 through an undesired current path 121. This can cause serious damage to the inverter 118. When there are more than two power domains in the ESD protection system 100, the above-mentioned drawback will become even more serious.

Figure 2:
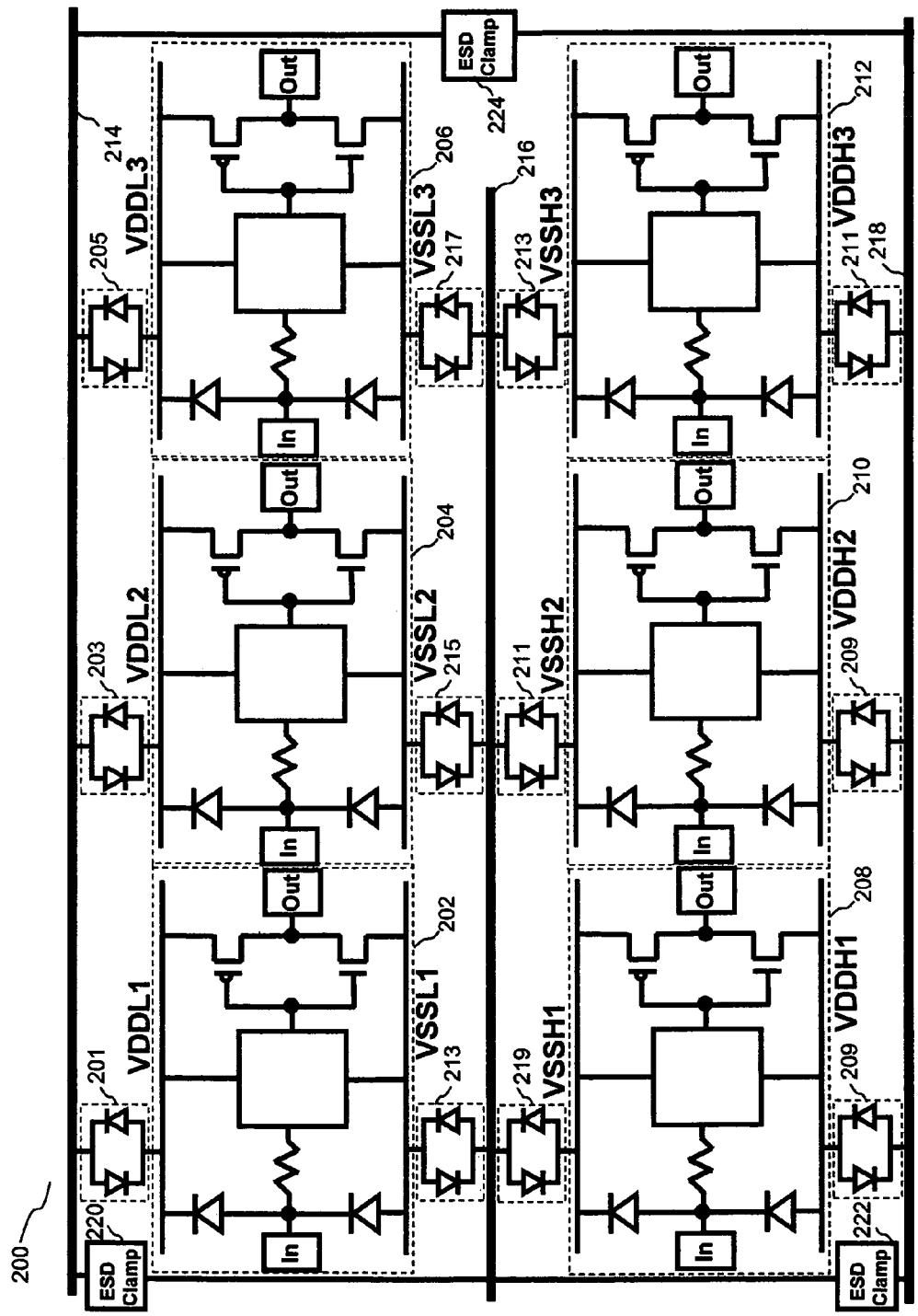
FIG. 2 illustrates another conventional multi-power domain ESD protection system.

FIG. 2 illustrates another conventional multi-power domain ESD protection system 200. The protection system 200 includes six circuit modules 202, 204, 206, 208, 210, and 212. Three circuit modules 202, 204, and 206 are designed to operate under core supply voltages VDDL1, VDDL2 and VDDL3, while the other three circuit modules 208, 210, and 212 are designed to operate under I/O supply voltages VDDH1, VDDH2 and VDDH3. Three dedicated ESD buses 214, 216, and 218 are implemented for dissipating the ESD current. The dedicated ESD bus 214 is connected to the core supply voltages VDDL1, VDDL2, and VDDL3 through back-to-back diode sets 201, 203 and 205, respectively. The dedicated ESD bus 218 is connected to the I/O supply voltages VDDH1, VDDH2, and VDDH3 through back-to-back diode sets 207, 209 and 211, respectively. The dedicated ESD bus 216 is connected to the ground buses VSSL1, VSSL2, VSSL3, VSSH1, VSSH2, and VSSH3 through the back-to-back diode sets 213, 215, 217, 219, 211 and 213, respectively. Three ESD clamps 220, 222, and 224 are placed among the ESD buses 214, 216 and 218 for passing the ESD current during the ESD event.

One disadvantage of the ESD protection system 200 is that the dedicated ESD buses 214, 216, and 218 require additional layout areas. Another disadvantage is that the back-to-back diode sets would incur serious damages to the devices within the circuit modules 202, 204, 206, 208, 210 and 212 during the ESD event.

Figure 3:
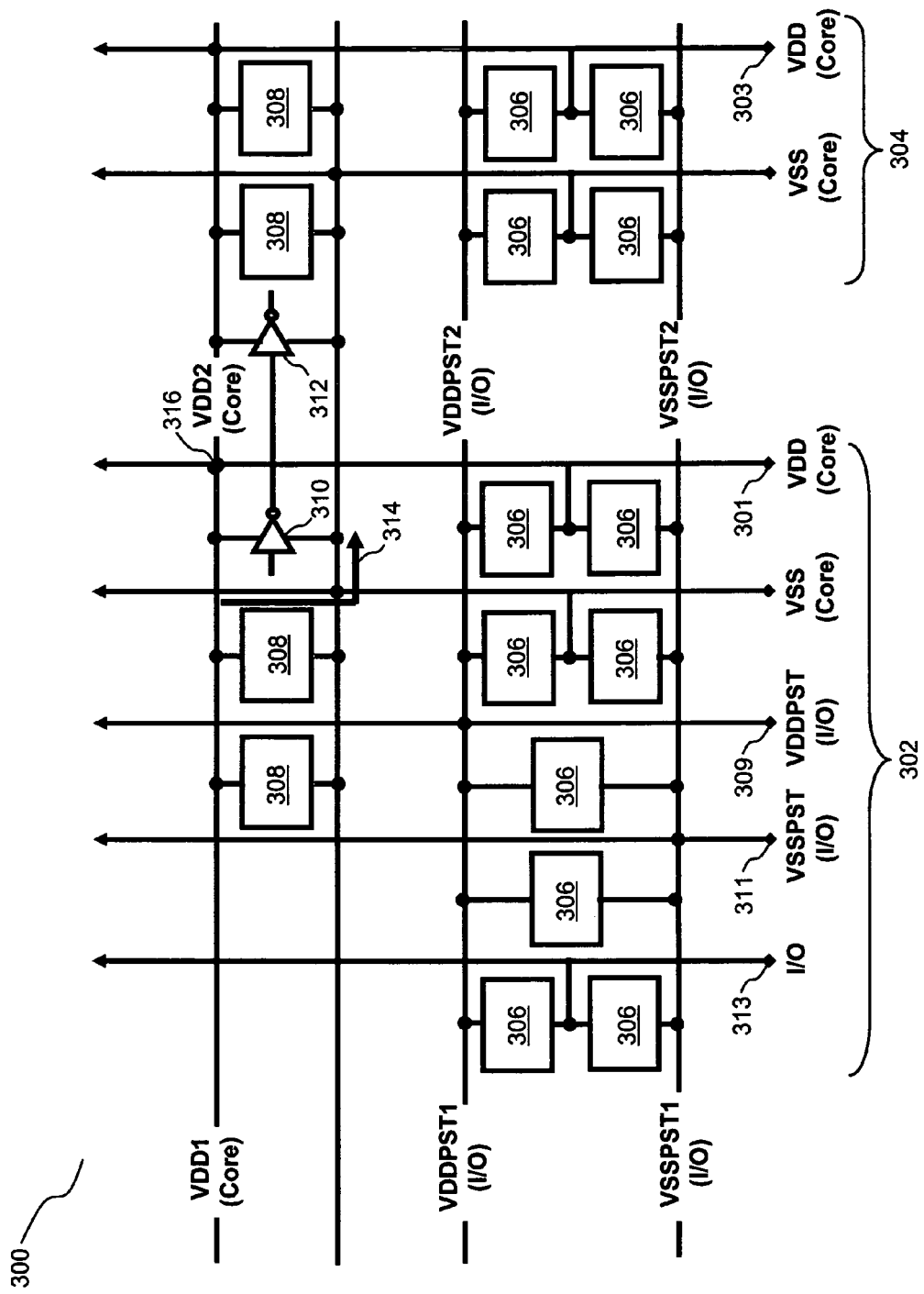
FIG. 3 illustrates an ESD protection system for multi-power domain circuitry in accordance with one embodiment of the present invention.

FIG. 3 illustrates an ESD protection system 300 for multi-power domain circuitry in accordance with one embodiment of the present invention. In this embodiment, the protection system 300 is designed to provide ESD protection for circuitry operating in two power domains, such as an I/O power domain 302 and a core power domain 304. However, it is noted that the principles of the invention is by no means limited to an application of only two power domains, and can be applied to three or more power domains.

A number of bus lines are arranged for the power domains 302 and 304. A core power supply bus VDD1, which is coupled to a core power supply pin 301 in the I/O power domain 302, is implemented for providing devices in the I/O power domain 302 with a core supply voltage. A core power supply bus VDD2, which is coupled to a core power supply pin 303 in the core power domain 304, is implemented for providing devices in the core power domain 302 with a core supply voltage. In this embodiment, the core power supply buses VDD1 and VDD2 are properly isolated from one another for the two domains 302 and 304.

An I/O power supply bus VDDPST1 and I/O ground bus VSSPST1, which are coupled to an I/O power supply pin 309 and I/O ground pin 311, respectively, in the I/O power domain 302, are implemented for providing devices in the I/O power domain 302 with an I/O supply voltage and electrical ground. An I/O power supply bus VDDPST2 and I/O ground bus VSSPST2 are implemented for providing devices in the core power domain 304 with an I/O supply voltage and electrical ground, respectively. In this embodiment, the I/O power supply buses VDDPST1 and VDDPST2 are properly isolated from one another for the two domains 302 and 304. Similarly, the I/O ground buses VSSPST1 and VSSPST2 are properly isolated from one another as well. No diode module is interposed between the I/O ground buses VSSPST1 and VSSPST2.

An I/O bus, which is connected to an I/O pin 313, is implemented for inputting or outputting signals in the I/O power domain 302. A core ground bus VSS is disposed across the core power domain 302 and the core power domain 304 for providing devices at the two domains with electrical ground. The core ground bus VSS serves as a global ESD bus for both domains to dissipate the ESD current during the ESD event. In the following description, the term "core ground bus" and "global ESD bus" will be used interchangeably. Since the core ground bus VSS is used as the global ESD bus, the SSO noise is not an issue here. For this reason, placement of the back-to-back diodes on the core ground bus VSS between the power domains 302 and 304 is not necessary.

Various ESD protection devices 306 are implemented between the I/O power supply bus VDDPST1 and the I/O ground bus VSSPST1 in the I/O power domain 302, and between the I/O power supply bus VDDPST2 and the I/O ground bus VSSPST2 in the core power domain VSSPST2. When an ESD event occurs at the I/O power supply bus VDDPST1 or VDDPST2, one or more of the ESD protection devices 306 will switch on, and pass the ESD current to the I/O ground bus VSSPST1 or VSSPST2. Various ESD protection devices 308 are implemented between the core power supply bus VDD1 and the global ESD bus VSS in the core power domain 302 and between the core power supply bus VDD2 and the global ESD bus VSS in the core power domain 304. When an ESD event occurs at the core power supply bus VDD1 or VDD2, one or more of the ESD protection devices 308 will switch on, and pass the ESD current to the global ESD bus VSS.

In this embodiment, an inverter 310 is used to represent a logic device coupled between the I/O power supply bus VDD1 and the global ESD bus VSS in the I/O power domain 302, while another inverter 312 is used to represent a logic device coupled between the core power supply bus VDD2 and the global ESD bus VSS in the core power domain 304. In a normal operation, the ESD protection devices 308 stay off so that the inverters 310 and 312 can function properly. During an ESD event, one or more of the ESD protection devices 308 are turned on to dissipate the ESD current. For example, a current path 314 is used to demonstrate a possible ESD occurrence scenario when the ESD current enters the system 300 at a node 316 that is connected to the inverter 310 in the I/O power domain 302. The harmful ESD current is designed to travel past an ESD protection device 308 to the global ESD bus VSS and then dissipates. As shown in this figure, the I/O ground bus VSSPST1 and the core ground bus VSSPST2 are properly isolated and no back-to-back diode sets are provided therebewteen. Thus, the possibility of having the ESD current travel directly from the inverter 310 to the inverter 312 through a signal line connected therebetween is significantly reduced. As such, the inverter 312 is protected from the harmful ESD current.

It is noted that the inverters 310 and 312 are illustrated for purposes of description. They can be replaced by any other electronic devices and logic modules without deviating from the principles of the invention. It is understood by those skilled in the art that the ESD protection devices 306 and 308 can be any devices that serve the purposes of protecting the logic devices against the ESD current. For example, the ESD protection device 306 and 308 includes, but not being limited to, a dido string, thick-field-oxide (TFO) clamps, grounded-gate NMOS (GGNMOS) device, silicon controlled rectifier (SCR), etc.

The invention as exemplified by the protection system 300 improves the ESD protection performance for the logic devices at both domains 302 and 304. The proposed system is particularly advantageous for the devices fabricated by advanced semiconductor processing technology, which usually produces a MOS transistor with a gate dielectric of a thickness equal to or smaller than 30 angstroms. There is no power domain number limitation with this system, thereby making it useful in multiple power domain applications. The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An integrated circuit chip comprising:
   a first device coupled between a first core power supply bus and a core ground bus in a first power domain;
   a second device coupled between a second core supply bus and the core ground bus in a second power domain;

an electrostatic discharge (ESD) bus coupled to the core ground bus of the first and second devices for providing a current path to dissipate an ESD current during an ESD event occurring at the first or second device;

a first I/O power supply bus and a first I/O ground bus disposed in the first power domain; and a second I/O power supply bus and a second I/O ground bus disposed in the second power domain, wherein the first I/O ground bus is isolated from the second I/O ground bus and the ESD bus, respectively, wherein the ESD bus is disposed across the first and second power domains without having a diode module interposed therebetween, thereby preventing the ESD current from flowing through the first and second devices.

2. The integrated circuit chip of claim 1 wherein the first or second device comprises at least one MOS transistor having a gate dielectric of a thickness no greater than 30 angstroms.

3. The integrated circuit chip of claim 1 wherein the first device is coupled between the first core power supply bus and the ESD bus in the first power domain.

4. The integrated circuit chip of claim 3 wherein the second device is coupled between the second core power supply bus and the ESD bus in the second power domain.

5. The integrated circuit chip of claim 1 wherein the first core power supply bus and the second core power supply bus are isolated from one another.

6. The integrated circuit chip of claim 1 wherein the first I/O power supply bus and the second I/O power supply bus are isolated from one another.

7. An integrated circuit chip having a first power domain and a second power domain, comprising:

an electrostatic discharge (ESD) bus disposed across the first and second power domains without having a diode module interposed therebetween;

a first device coupled between a first core power supply bus and the ESD bus in the first power domain;

a second device coupled between a second core power supply bus and the ESD bus in the second power domain;

a first I/O power supply bus and a first I/O ground bus disposed in the first power domain;

a second I/O power supply bus and a second I/O ground bus disposed in the second power domain, wherein the first I/O ground bus is isolated from the second I/O ground bus and the ESD bus, respectively;

a first ESD protection device coupled between the first core power supply bus and the ESD bus in the first power domain; and a second ESD protection device coupled between the second core power supply bus and the ESD bus in the second power domain, wherein the first or second ESD protection device is switched on for dissipating an ESD current from the first or second core power supply bus to the ESD bus during an ESD event, thereby preventing the ESD current from flowing through the first and second devices.

8. The integrated circuit chip of claim 7 wherein the first or second device comprises at least one MOS transistor having a gate dielectric of a thickness no greater than 30 angstroms.

9. The integrated circuit chip of claim 7 wherein the first core power supply bus and the second core power supply bus are isolated from one another.

10. An electrostatic discharge (ESD) protection system having a multi-power domain including a first power domain and a second power domain, comprising:

an ESD bus disposed across the first and second power domains without having a diode module interposed therebetween;

a first device coupled between a first core power supply bus and the ESD bus in the first power domain;

a second device coupled between a second core power supply bus and the ESD bus in the second power domain, the first or second device having at least one MOS transistor with a gate dielectric of a thickness no greater than 30 angstroms;

a first I/O power supply bus and a first I/O ground bus disposed in the first power domain; and a second I/O power supply bus and a second I/O ground bus disposed in the second power domain, wherein the first I/O ground bus is isolated from the second I/O ground bus and the ESD bus, respectively;

a first ESD protection device coupled between the first core power supply bus and the ESD bus in the first power domain;

a second ESD protection device coupled between the second core power supply bus and the ESD bus in the second power domain, wherein the first or second ESD protection device is switched on for dissipating an ESD current from the first or second core power supply bus to the ESD bus during an ESD event, thereby preventing the ESD current from flowing through the first and second devices.

* * * * *